United States Patent
Kim et al.

(10) Patent No.: US 11,047,614 B2
(45) Date of Patent: Jun. 29, 2021

(54) DISPLAY DEVICE FOR REFRIGERATOR DOOR

(71) Applicant: LG ELECTRONICS INC., Seoul (KR)

(72) Inventors: Sang Oh Kim, Seoul (KR); Dul Lae Min, Seoul (KR); Junsang Yun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 435 days.

(21) Appl. No.: 16/303,528

(22) PCT Filed: May 19, 2017

(86) PCT No.: PCT/KR2017/005237
§ 371 (c)(1),
(2) Date: Nov. 20, 2018

(87) PCT Pub. No.: WO2017/204496
PCT Pub. Date: Nov. 30, 2017

(65) Prior Publication Data
US 2020/0326120 A1    Oct. 15, 2020

(30) Foreign Application Priority Data

May 23, 2016    (KR) .......... 10-2016-0062926

(51) Int. Cl.
*F25D 23/04*    (2006.01)
*F25D 23/02*    (2006.01)
(Continued)

(52) U.S. Cl.
CPC .......... *F25D 23/04* (2013.01); *F21V 33/0044* (2013.01); *F25D 23/028* (2013.01);
(Continued)

(58) Field of Classification Search
CPC ........ F25D 23/04; F25D 23/028; F25D 23/06; F25D 2323/023; G02F 1/13345;
(Continued)

(56) References Cited

U.S. PATENT DOCUMENTS

| 2010/0073271 A1 | 3/2010 | Hwang et al. |
| 2012/0285089 A1 | 11/2012 | Artwohl et al. |
| 2014/0232958 A1* | 8/2014 | Venturas ........... G02F 1/133615 349/12 |

FOREIGN PATENT DOCUMENTS

| JP | 2009-093023 | 4/2009 |
| KR | 10-2015-0050053 | 5/2015 |

(Continued)

OTHER PUBLICATIONS

International Search Report (with English Translation) and Written Opinion dated Aug. 16, 2017 issued in Application No. PCT/KR2017/005237.

*Primary Examiner* — Anne M Hines
(74) *Attorney, Agent, or Firm* — KED & Associates, LLP

(57) ABSTRACT

The present invention relates to a display device for a refrigerator door. The display device for a refrigerator door, according to one embodiment of the present invention, comprises: a first panel made of a transparent material; a second panel made of a transparent material, and disposed so as to be spaced apart from the first panel by a predetermined interval; and a display module disposed between the first panel and the second panel, wherein the display module comprises a plurality of light emitting elements disposed in a predetermined pattern, a first wire electrically connected to the light emitting elements, and a second wire electrically connected to the light emitting elements, and disposed so as to intersect with the first wire. The present invention has benefit of enabling user to easily visually check, from the (Continued)

outside of a refrigerator, information related to the refrigerator and stored goods stored inside the refrigerator.

20 Claims, 12 Drawing Sheets

(51) Int. Cl.
  *F25D 23/06* (2006.01)
  *H05K 1/18* (2006.01)
  *G02F 1/1345* (2006.01)
  *F21V 8/00* (2006.01)
  *G02F 1/13357* (2006.01)
  *G02F 1/1334* (2006.01)
  *F21V 33/00* (2006.01)

(52) U.S. Cl.
  CPC ............ *F25D 23/06* (2013.01); *G02B 6/0068* (2013.01); *G02B 6/0073* (2013.01); *G02F 1/1345* (2013.01); *G02F 1/13345* (2021.01); *G02F 1/133603* (2013.01); *H05K 1/189* (2013.01); *F25D 2323/023* (2013.01); *H05K 2201/10128* (2013.01)

(58) Field of Classification Search
  CPC ............. G02F 1/133603; G02F 1/1345; F21V 33/044; G02B 6/0068; G02B 6/0073; H05K 1/189; H05K 2201/10128
  See application file for complete search history.

(56) References Cited

FOREIGN PATENT DOCUMENTS

| KR | 10-1542883 | 8/2015 |
|----|------------|--------|
| KR | 10-1612468 | 4/2016 |

\* cited by examiner

DISPLAY DEVICE FOR REFRIGERATOR DOOR

CROSS-REFERENCE TO RELATED PATENT APPLICATIONS

This application is a U.S. National Stage Application under 35 U.S.C. § 371 of PCT Application. No. PCT/KR2017/005237, filed May 19, 2017, which claims priority to Korean Patent Application No. 10-2016-0062926, filed May 23, 2016, whose entire disclosures are hereby incorporated by reference.

TECHNICAL FIELD

This application relates to a display device for a refrigerator door, and more particularly, to a display device for a refrigerator door made of a transparent material visible from an outside of a refrigerator.

BACKGROUND ART

A refrigerator is a device which can keep food fresh for a certain period by cooling a freezer compartment or a refrigerator compartment to a specific temperature while repeating a freezing or refrigeration cycle. Generally, a main body that forms a storage space and a door that opens or closes a storage space are included in the refrigerator. Stored goods such as food are stored in the storage space, and the user can open the door to keep the stored goods or to take out the kept stored goods.

According to the related art, the most basic and important function of the door of the refrigerator that has the above structure is to facilitate a storage or a take-out of the stored goods while making a cool air in the storage space formed inside a main body not leak to the outside of the refrigerator. In accordance with these requirements, a conventional refrigerator door has been made of an opaque material that is advantageous for cool air maintenance but cannot see the storage space inside the refrigerator from the outside.

However, according to a widespread supply of the refrigerator, in addition to the basic function mentioned above, various requirements for an additional function of the refrigerator are increasing. Recently, a refrigerator that has a door that displays various information related to a refrigerator, for example, information related to a control of the refrigerator or information on the stored goods stored inside the refrigerator is being developed. In such a refrigerator, a display device capable of displaying various information is coupled to the outer surface of the refrigerator door made of an opaque material. The information related to the control of the refrigerator, for example, the information related to the stored goods stored inside the refrigerator or a temperature of the storage compartment of the refrigerator, is displayed through the display device.

On the other hand, in recent years, a refrigerator that has a door made of a transparent material such as glass is being developed. As described above, through the door made of the transparent material, the user can identify as to which stored goods are stored inside the storage compartment of the refrigerator without opening the door, so that it is possible to reduce a loss of a cool air and to save time for searching the stored goods.

FIG. 1 is a front view of a refrigerator that has a door made of a transparent material according to the related art.

A refrigerator 102 according to the related art shown in FIG. 1 has four main doors 104, 106, 108, and 110. Among them, three main doors 104, 108 and 110 are made of an opaque material as mentioned above; however a main door 106 is made of a transparent material, for example, a glass material.

As shown in FIG. 1, the refrigerator 102 of the prior art can grasp the stored goods stored in an inner space closed by the main door 106 without opening the main door 106 by adopting a transparent material 12. Further, a display module 14 to display various information related to the refrigerator is provided as in FIG. 1 at a lower end of a front surface of the main door 106 of the refrigerator 102 according to the related art.

FIG. 2 is a configuration view of a main door 106 made of a transparent material shown in FIG. 1. As shown in FIG. 2, a main door 106 according to the prior art includes a main frame 202. The main frame 202 may be rotatably connected to a main body of a refrigerator by a hinge portion (not shown). A plurality of baskets 204, 206, and 208 for storing stored goods may be mounted inside the main frame 202.

Further, as shown in FIG. 2, a sub door 210 is rotatably connected to a right side of the main frame 202 via a hinge portion (not shown). A transparent panel (212) is mounted on the sub door 210. The stored goods stored in the baskets 204, 206, 208 of the refrigerator 102 or the stored goods stored in the storage compartment can be seen through the transparent panel 212 without opening the main door 106. Accordingly, the user can identify the stored goods inside the refrigerator 102 with the naked eye without opening the main door 106 or the sub door 210, and open the main door 106 or the sub door 210, if necessary, to take out the stored goods.

Meanwhile, the conventional sub door 210 or transparent panel 212 shown in FIG. 2 does not have a function to display information related to the refrigerator. Instead, a separate display module 214 is mounted on a lower surface of the main frame 202 as in FIG. 2. The display module 214 is realized by a display using an LED or a liquid crystal display.

Finally, according to the related art, as shown in FIG. 2, the transparent panel 212 for identifying the stored goods in a refrigerator 102 does not have the function to display the information, and instead, the separate display module 214 for displaying the information is provided in the main frame 202. According to such a conventional structure, since the display module 214 covers the basket 208 or an inner space of the refrigerator in a rear surface of the basket 208, a range of a space visible through the transparent panel 212 is reduced. Further, due to a presence of the display module 214, it becomes very difficult to take out the stored goods stored in the inner space of the refrigerator at the rear surface of the basket 208 or the basket 208.

Further, due to a distance between the transparent panel 212 of the sub door 210 and the display module 214, it may become difficult for the user to recognize information displayed through the display module 214 from an outside through the transparent panel 212. Therefore, there is also a difficulty that a separate component or configuration is required to allow the information displayed through the display module 214 to be more clearly recognized from the outside, and thus, a production cost of the refrigerator is increased. In addition, there is also a problem that an aesthetic sensibility of the refrigerator 102 itself is degraded since the user always sees the display module 214 when the user opens the sub door 210.

DISCLOSURE

Technical Problem

It is an object of this application to provide a display device for a refrigerator door that enables a user to easily confirm information related to a refrigerator together with stored goods stored inside the refrigerator with the naked eye from the outside of the refrigerator.

Further, it is an object of this application to provide a display device for a refrigerator door in which a display module for displaying information related to a refrigerator is not required to arrange separately from a transparent panel in applying a transparent panel to the refrigerator door.

Further, it is an object of this application to provide a display device for a refrigerator door that can reduce a production cost of a refrigerator by realizing an information display function and an identification function of the stored goods stored inside the refrigerator through a device.

Further, it is an object of this application to provide a display device for a refrigerator door capable of improving an aesthetic sensibility of the refrigerator door and a refrigerator product itself by realizing the display module for displaying the information related to the refrigerator integrally with a transparent panel.

The objects of this application are not limited to the above-mentioned objects, and the other objects and advantages of this application which are not mentioned can be understood by the following description, and more clearly understood by the embodiment of this application. It will also be easily seen that the objects and advantages of this application may be realized by means indicated in the patent claims and a combination thereof.

Technical Solution

In this application to achieve this object, a display device for a refrigerator door is characterized in including a first panel made of a transparent material; a second panel made of a transparent material and spaced apart from the first panel by a predetermined distance; and a display module arranged between the first panel and the second panel; and wherein the display module includes: a plurality of light emitting elements arranged in a predetermined pattern; a first wire electrically connected to the light emitting element; and a second wire electrically connected to the light emitting element and arranged to intersect with the first wire.

Advantageous Effects

According to this application as mentioned above, there is an advantage that a user can easily confirm information related to a refrigerator together with stored goods stored inside a refrigerator with the naked eye from an outside of the refrigerator.

Further, according to this application, in applying a transparent panel to a refrigerator door, there is an advantage that there is no need to arrange a display module for displaying information related to the refrigerator separately from a transparent panel. As described above, when a separate display module is excluded, a range of an inner space that the user can confirm with the naked eye is more widened, and it becomes easier to take out the stored goods stored inside the refrigerator.

Further, according to this application, there is an advantage of capable of reducing a production cost of the refrigerator by realizing an identification function and an information display function of the stored goods stored inside the refrigerator through a device.

Further, according to this application, there is an advantage capable of improving an aesthetic sensibility of the refrigerator door and the refrigerator door itself by realizing the display module for displaying the information related to the refrigerator integrally with a transparent panel.

BEST MODE

Figure 1:
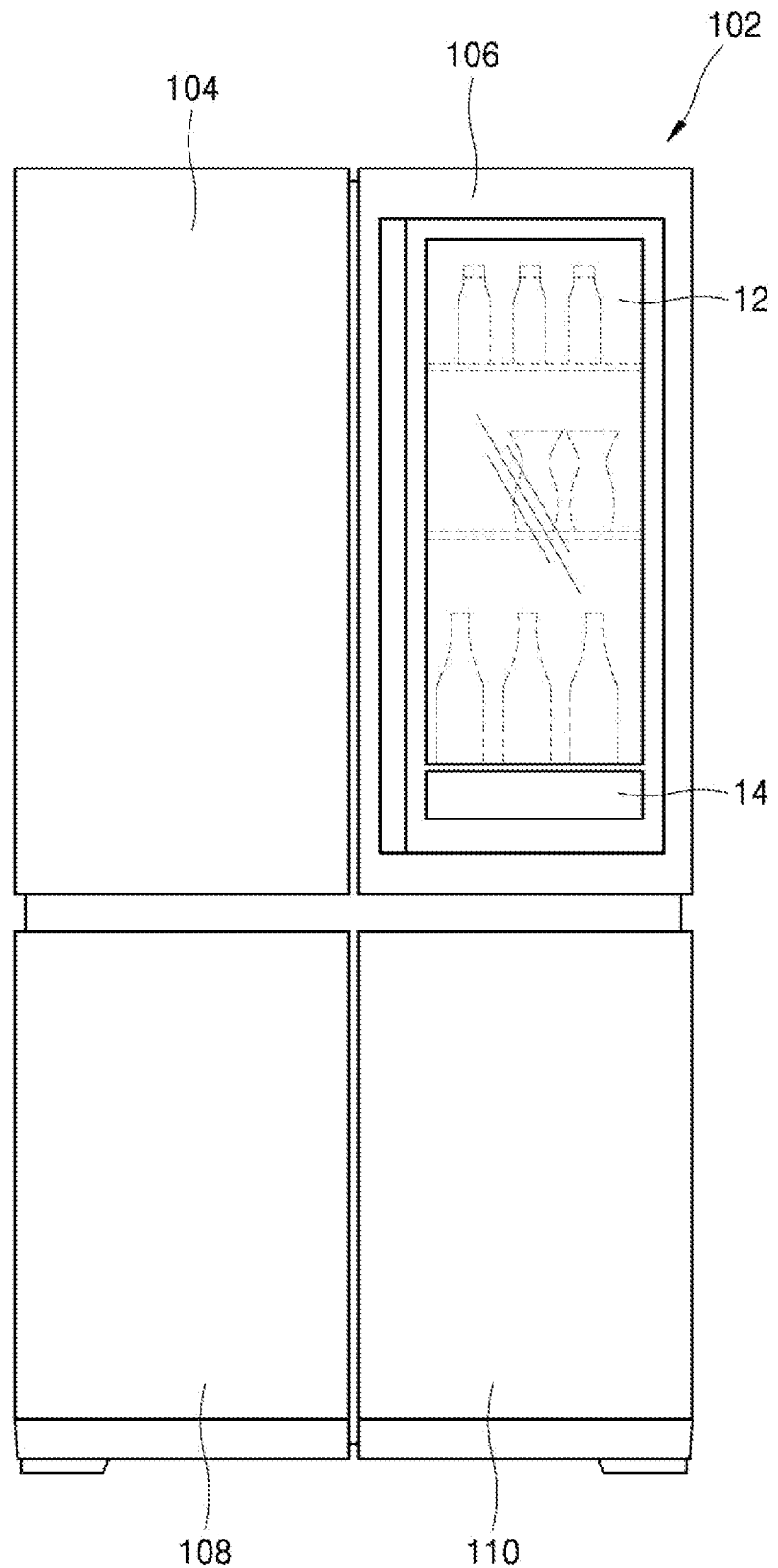
FIG. 1 is a front view of a refrigerator that has a door made of a transparent material according to the prior art.

The above mentioned objects, features and advantages of this application will be described in detail with reference to the accompanying drawings, and accordingly, those skilled in the art to which this application pertains can easily perform the technical idea of this application. In describing this application, when it is determined that the detailed description of the known art related to this application may unnecessarily obscure the gist of this application, a detailed description thereof will be omitted. Hereinafter, a preferred embodiment according to this application will be described in detail with reference to the accompanying drawings. The same reference numeral in the drawings is used to indicate the same or similar component.

Figure 3:
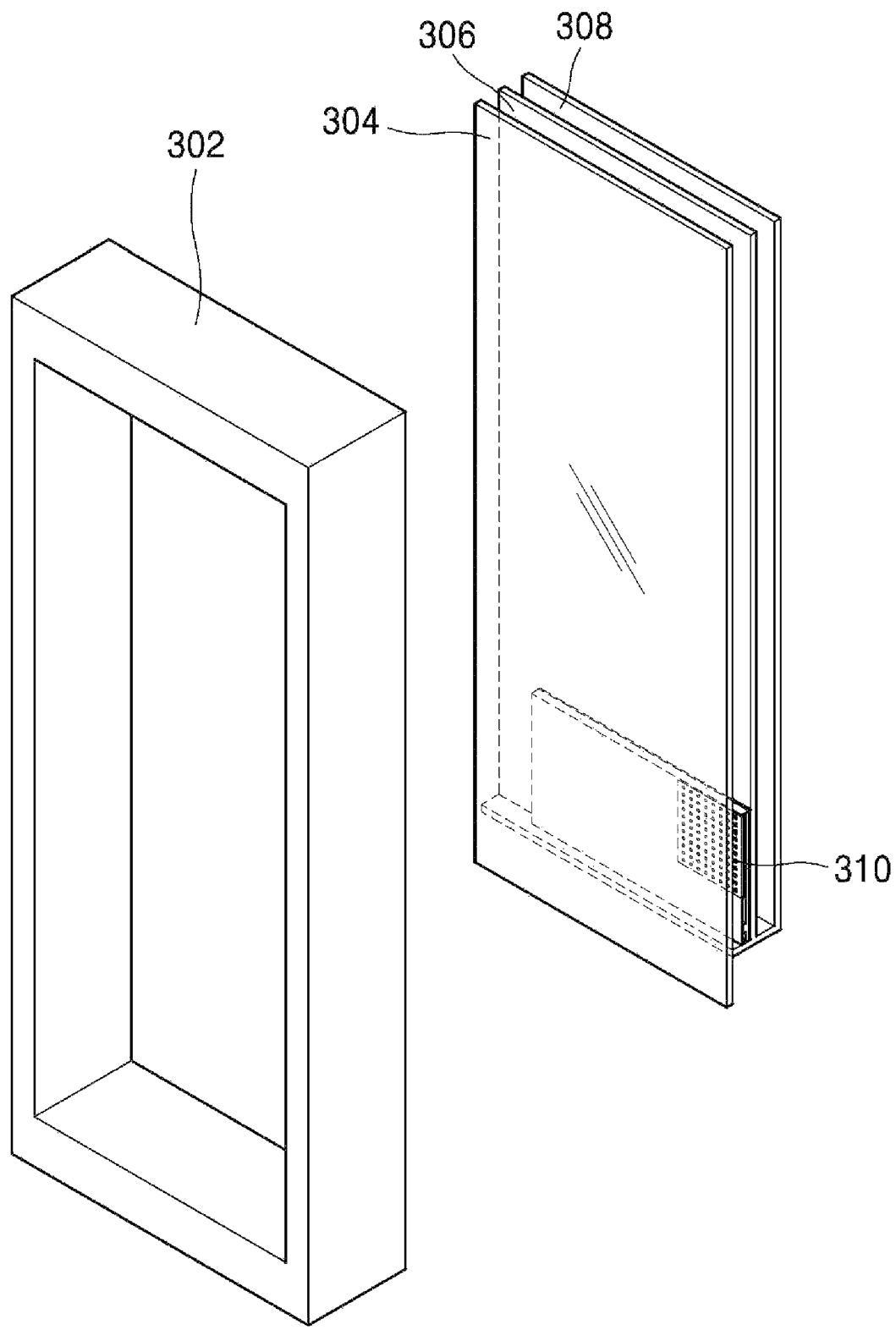
FIG. 3 is an overall configuration view of a display device for a refrigerator door according to a first embodiment of this application.

FIG. 3 is an overall configuration view of a display device for a refrigerator door according to a first embodiment of this application.

Referring to FIG. 3, a display device for a refrigerator door according to a first embodiment of this application may include a first panel 304, a second panel 306, and a display module 310 arranged between the first panel 304 and the second panel 306. Further, the display device for the refrigerator door according to the first embodiment of this application may further include a third panel 308 arranged on a rear surface of the second panel 306. Further, the display device for the refrigerator door according to the first embodiment of this application may further include a frame 302 for fixing the first panel 304, the second panel 306, and the third panel 308.

The first panel 304 and the second panel 306 may each be made of a transparent material, for example, a material such as a transparent glass or a transparent plastic. Accordingly, a user can identify the stored goods inside a refrigerator with the naked eye through the first panel 304 and the second panel 306. A coating for realizing a special function, for example, a mirror coating, may be applied to a front surface or a rear surface of the first panel 304.

The second panel 306 may be spaced apart from the first panel 304 by a predetermined distance. Accordingly, a first space that has a predetermined transverse length, vertical length, and depth may be formed between the first panel 304 and the second panel 306.

As shown in FIG. 3, the display module 310 may be arranged in a first space formed between the first panel 304 and the second panel 306. In FIG. 3, the display module 310 may be shown as being arranged in a lower portion of the first space; however, a position of the display module 310 in the first space may vary according to an embodiment. The display module 310 may be supplied with a power by a power supply portion (not shown), and can display information related to a refrigerator according to a control by a control portion (not shown). In one embodiment of this application, the display module 310 may include a plurality of light emitting elements for an information display, and a first wire and a second wire for making a light emitting element emit a light. A detailed configuration of the display module 310 will be described in more detail through FIG. 4. The display module may also be realized as a liquid crystal display according to an embodiment.

The third panel 308 may be spaced apart from the second panel 306 by a predetermined distance. The third panel 308 may also be made of the same transparent material as the first panel 304 and the second panel 306. The distance between the first panel 304 and the second panel 306 and the distance between the second panel 306 and the third panel 308 may be the same each other or different from each other. Another module other than the display module 310 may be additionally arranged in a second space formed between the second panel 306 and the third panel 308.

The first panel 304, the second panel 306, and the third panel 308 may be inserted into and fixed to the frame 302 shown in FIG. 3. As the first panel 304, the second panel 306, and the third panel 308 are inserted into and fixed to the frame 302, a first space formed between the first panel 304 and the second panel 306 and a second space formed between the second panel 306 and the third panel 308 may be sealed from an outside. Gas for thermal insulation for blocking a phenomenon in which a cool air inside the refrigerator leaks to the outside may be injected in each of the first space and the second space.

Although not shown in FIG. 3, a hinge portion (not shown) may be provided at a side portion of the frame 302. When the hinge portion (not shown) is provided at the side portion of the frame 302, the display device for the refrigerator door shown in FIG. 3 can be operated as a sub door by being rotatably connected to a main frame 202 of a main door 106 in the same manner as a sub door 210 shown in FIG. 2. In another embodiment of this application, the display device for the refrigerator door may be mounted on the refrigerator as a main door, not a sub door as in FIG. 2 (see FIG. 11) and may be inserted into and fixed to a part of the refrigerator door, thereby having a function as a window (see FIG. 12).

Figure 2:
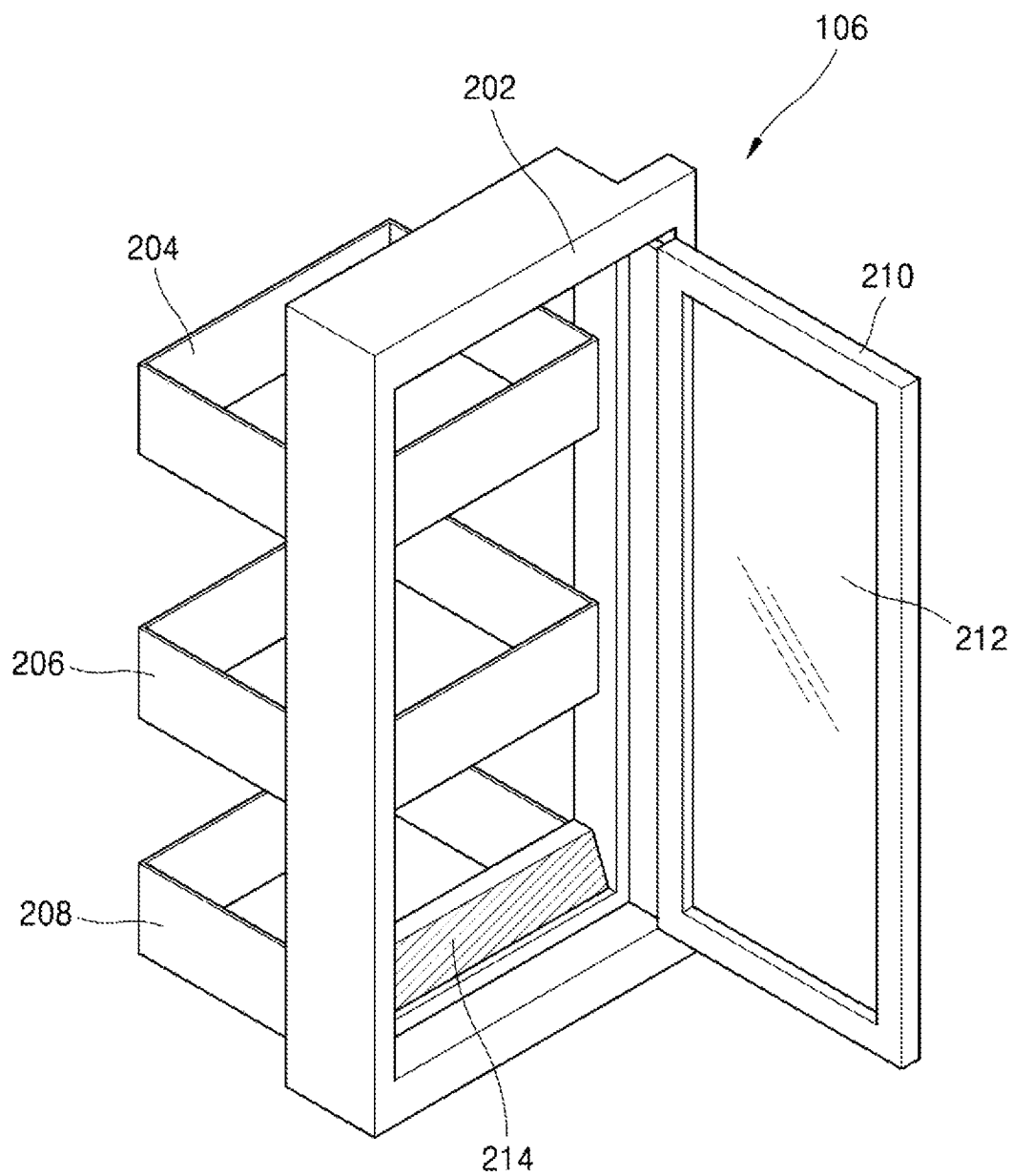
FIG. 2 is a configuration view of a door made of a transparent material shown in FIG. 1.

Finally, when applying the display device for the refrigerator door that has a structure as in FIG. 3 to the refrigerator, in applying a transparent panel, a separate display module 214 shown in FIG. 2 is not required, and it is possible to realize an information display function by using the refrigerator door itself.

Hereinafter, a detailed configuration of the display device for the refrigerator door shown in FIG. 3 will be described in detail through FIG. 4.

Figure 4:
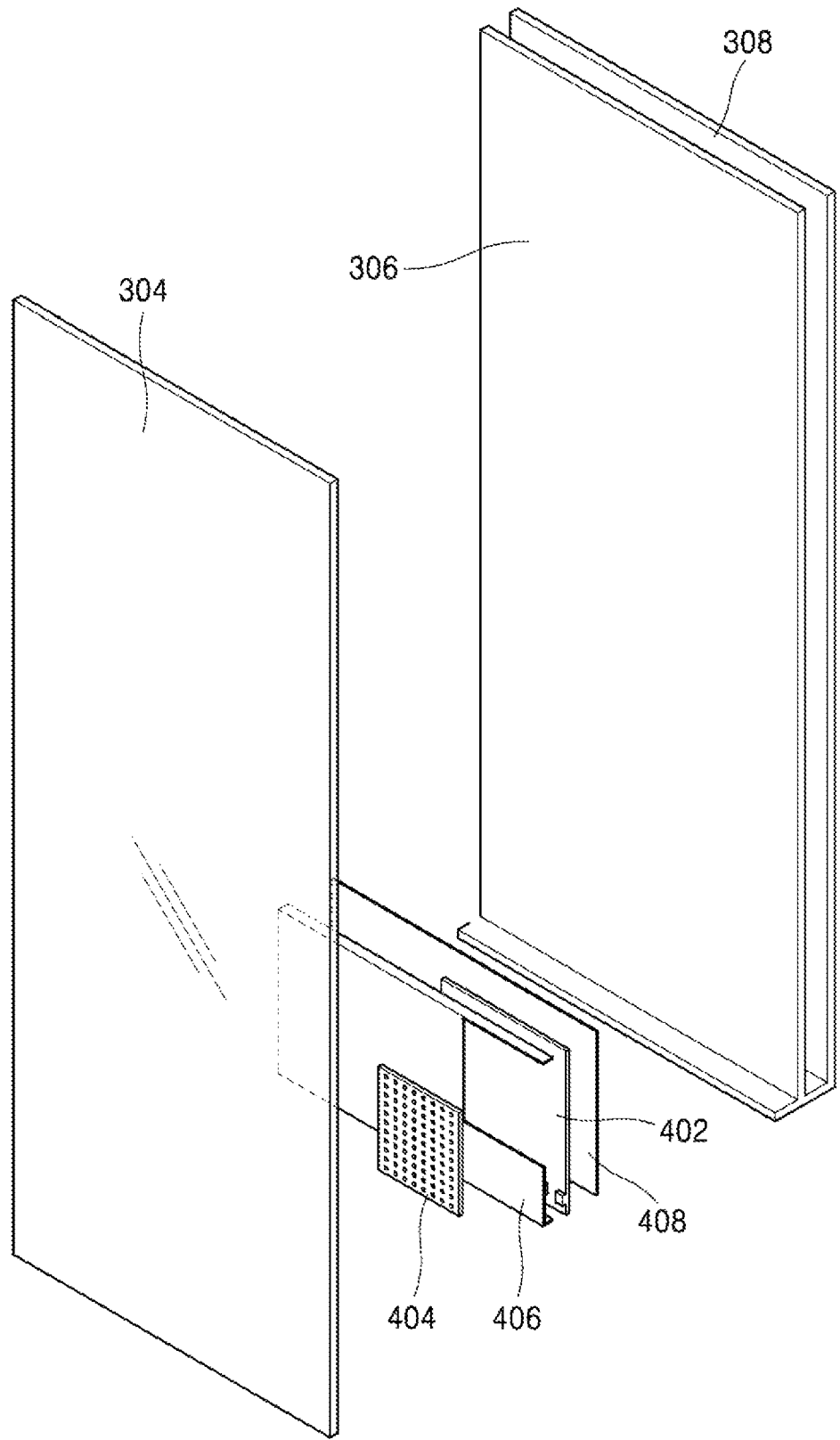
FIG. 4 is a detailed configuration view of a display device for a refrigerator door according to a first embodiment of this application.

FIG. 4 is a detailed configuration view of a display device for a refrigerator door according to a first embodiment of this application.

Referring to FIG. 4, the display device for a refrigerator door according to the first embodiment of this application may include a first panel 304, a second panel 306, and a third panel 308. As mentioned above, a display module according to this application may be arranged in a first space formed between the first panel 304 and the second panel 306.

As shown in FIG. 4, the display module may include a Printed Circuit Board (PCB) 402 and a guide plate 404. Further, the display module according to this application may include at least one cover plate mounted on a front surface or a rear surface of the PCB 402, that is, a front cover plate 406 and a rear surface cover plate 408.

A plurality of light emitting elements capable of displaying specific information by emitting a light or not emitting a light, for example, Light Emitting Diode (LED) can be arranged on the PCB 402 according to a predetermined pattern to form a plurality of pixels. Further, a first wire and a second wire for supplying an electric signal to the plurality of light emitting elements may be arranged on the PCB 402. A specific arrangement relationship of the light emitting element, the first wire, and the second wire will be described later with reference to FIGS. 6 to 8. The PCB 402 may be supplied with the electrical signal through a power supply portion (not shown) provided in the refrigerator. A supply of such an electrical signal can be controlled by a control portion (not shown).

The guide plate 404 may guide the light emitted from the light emitting element mounted on the PCB 402 and emit it in the first panel 304 direction. The guide plate 404 may have a plurality of holes corresponding to the light emitting elements arranged on the PCB 402 in a predetermined pattern. That is, the light emitted from the light emitting element corresponding to each hole may be condensed through the hole formed on the guide plate 404 and may be emitted to the first panel 304 direction. When using the guide plate 404, the light emitted from the light emitting element can be emitted in a desired direction, thereby improving an efficiency of an information display.

The front surface cover plate 406 and the rear surface cover plate 408 may be coupled in the front surface portion and rear surface portion directions of the PCB 402 to form an inner space in which the PCB 402 can be arranged. As shown in FIG. 4, a space for a mounting of the guide plate 404 may be formed in a part of the front surface cover plate 406.

Figure 5:
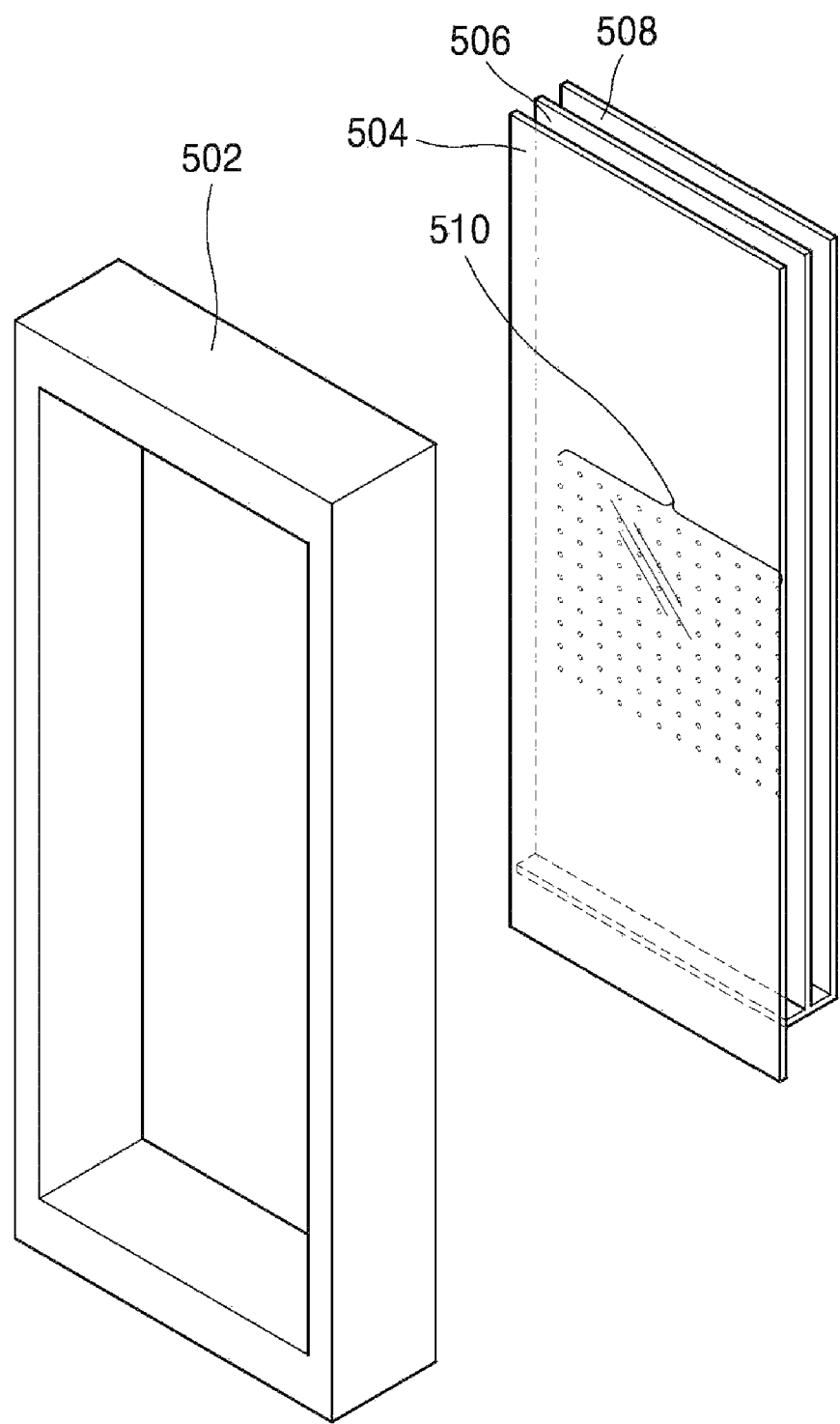
FIG. 5 is an overall configuration view of a display device for a refrigerator door according to a second embodiment of this application.

FIG. 5 is an overall configuration view of a display device for a refrigerator door according to a second embodiment of this application.

Referring to FIG. 5, a display device for a refrigerator door according to a second embodiment of this application may include a first panel 504, a second panel 506, and a display module 510 arranged between the first panel 504 and the second panel 506. Further, the display device for the refrigerator door according to the second embodiment of this application may further include a third panel 508 arranged on a rear surface of the second panel 506. Further, the display device for the refrigerator door according to the second embodiment of this application may further include a frame 502 for fixing the first panel 504, the second panel 506, and a third panel 508.

The first panel 504 and the second panel 506 may each be made of a transparent material, for example, a material such as transparent plastic or transparent glass. Accordingly, a user can identify the stored goods inside a refrigerator with the naked eye through the first panel 504 and the second panel 506. A coating for realizing a special function, for example, a mirror coating may be applied to a front surface or a rear surface of the first panel 504.

The second panel 506 may be spaced apart from the first panel 504 by a predetermined distance. Accordingly, a first space that has a predetermined transverse length, vertical length, depth is formed between the first panel 504 and the second panel 506.

In the embodiment of FIG. 5, the display module 510 may include a light emitting element, a first wire, and a second wire directly mounted on the second panel 506. For reference, only the light emitting element is shown on the second panel 506 of FIG. 5 for convenience of explanation. Further, a position where the display module 510 is arranged on the second panel 506 may vary depending on the embodiment. The display module 510 may be supplied with a power supply by a power supply portion (not shown), and can display information related to the refrigerator according to a control by a control portion (not shown). A detailed configuration of the display module 510 will be described in more detail through FIG. 6. The display module may also be realized as a liquid crystal display according to an embodiment.

The third panel 508 may be spaced apart from the second panel 506 by a predetermined distance. The third panel 508 may also be made of the same transparent material as the first panel 504 and the second panel 506. The distance between the first panel 504 and the second panel 506 and the distance between the second panel 506 and the third panel 508 may be the same each other or different from each other. Another module other than the display module 510 may be additionally arranged in a second space formed between the second panel 506 and the third panel 508.

The first panel 504, the second panel 506, and the third panel 508 may be inserted into and fixed to the frame 502 shown in FIG. 3. As the first panel 504, the second panel 506, and the third panel 508 are inserted into and fixed to the frame 502, the first space formed between the first panel 504 and the second panel 506 and the second space formed between the second panel 506 and the third panel 508 can be sealed from an outside. Gas for thermal insulation for blocking a phenomenon in which a cool air inside the refrigerator leaks to the outside may be injected in each of the first space and the second space.

Although not shown in FIG. 5, a hinge portion (not shown) may be provided on a side portion of the frame 502. When the hinge portion (not shown) is provided on the side portion of the frame 502, the display device for the refrigerator door shown in FIG. 5 can be operated as a sub door by being rotatably connected to a main frame 202 of a main door 106 in the same manner as in the sub door 210 shown in FIG. 2. In another embodiment of this application, the display device for the refrigerator door may be mounted in the refrigerator as a main door, not a sub door as in FIG. 2 (see FIG. 11), and may be inserted into and fixed to a part of the refrigerator door to have a function of a window (see FIG. 12).

Finally, in a case of applying the display device for the refrigerator door that has the structure as in FIG. 5 to a refrigerator, a separate display module 214 shown in FIG. 2 is not needed, and it is possible to realize an information display function by using the refrigerator door itself.

Hereinafter, an arrangement and a configuration of the light emitting element, the first wire, and the second wire, and the connecting element arranged on the second panel 506 according to the second embodiment of this application shown in FIG. 5 or the PCB 402 according to the first embodiment of this application shown in FIG. 4 will be described in more detail with reference to FIGS. 6 to 8.

Figure 6:
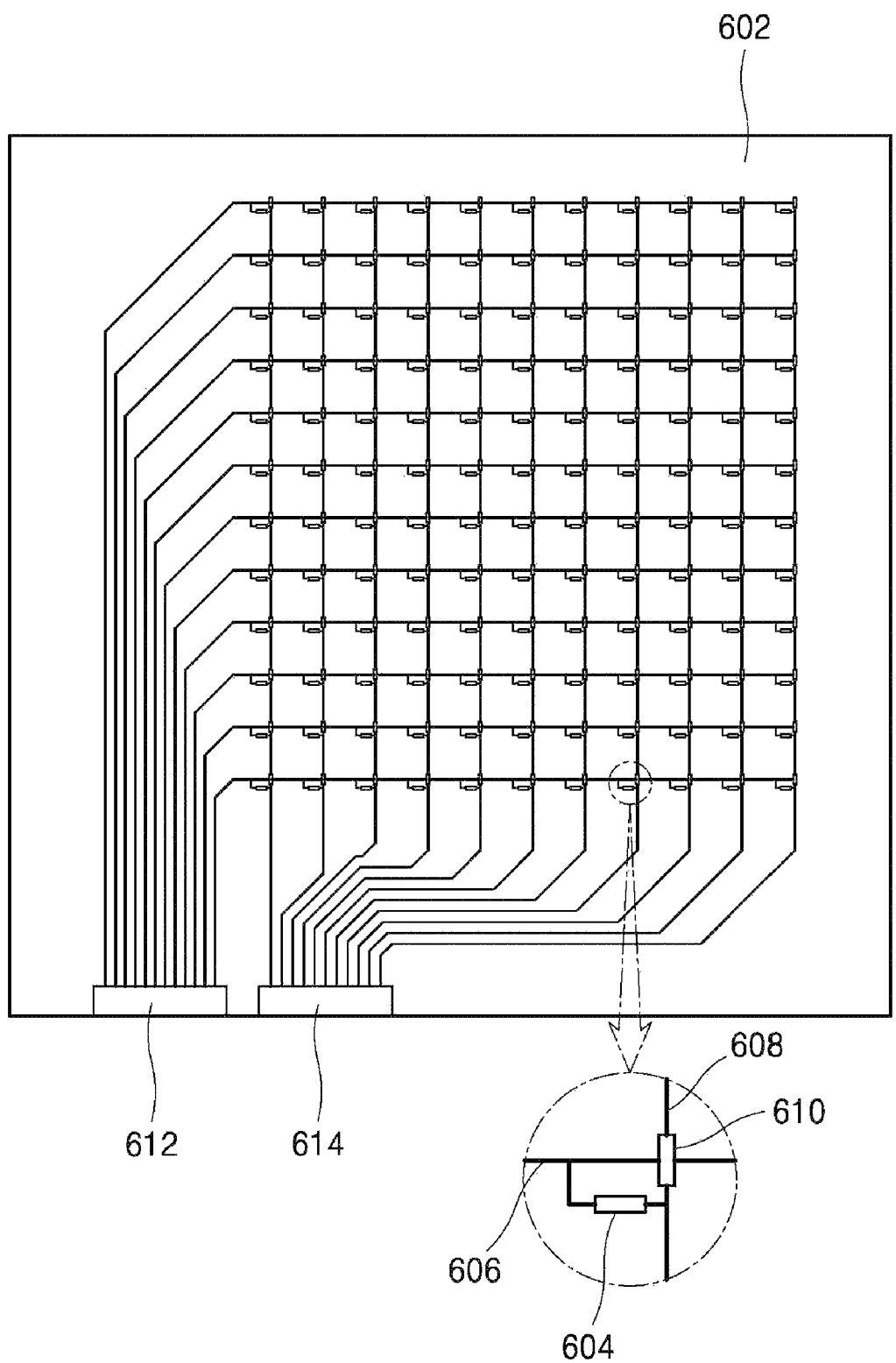
FIG. 6 is a configuration view of a light emitting device, a first wire, a second wire, and a connecting element included in a display module according to an exemplary embodiment of this application.

FIG. 6 is a configuration view of a light emitting element, a first wire, a second wire, and a connecting element included in a display module according to an embodiment of this application.

Referring to FIG. 6, the display module according to an embodiment of this application may include a plurality of light emitting elements (for example, 604) arranged in a predetermined pattern on a substrate 602. Further, a first wire (for example, 606) electrically connected to the light emitting element 604 may be arranged on the substrate 602. Further, a second wire (for example, 608), which is electrically connected to the light emitting element 604 and is arranged to intersect with the first wire 606, may be arranged on the substrate 602.

For reference, the first wire 606 and the second wire 608 are shown as being vertically intersecting to each other in FIG. 6. However, an angle formed by being intersected by the first wire 606 and the second wire 608 may vary according to the embodiment.

Further, the connecting element 610 that electrically connects both ends of the second wire 608 disconnected at an intersection point of the first wire 606 and the second wire 608 so as to prevent an electrical contact of the first wire 606 and the second wire 608 may be arranged on the substrate 602.

In this application, the substrate 602 may be made of various materials according to the embodiment. For example, according to the first embodiment of this application, the substrate 602 may be the PCB 402 shown in FIG. 4. In the first embodiment of this application, the light mitting element 604, the first wire 606, the second wire 608, and the connecting element 610 may be printed or mounted on the substrate 602 according to a production process of a PCB according to the prior art, respectively.

Further, according to the second embodiment of this application, the substrate 602 may be the second panel 506 shown in FIG. 5. In the second embodiment of this application, the substrate 602, that is, the second panel 506 may be a transparent material such as glass, and the light emitting element 604, the first wire 606, the second wire 608, and connecting element 610 may each be mounted directly on the substrate 602, through a process such as Surface Mounting Technology.

Further, in the second embodiment of this application, the first wire 606 and the second wire 608 mounted on the substrate 602 may be formed of a transparent electrode such as Indium Tin Oxide (ITO).

Referring again to FIG. 6, a first connector 612 connected to the first wire 606 and a second connector 614 connected to the second wire 608 may be arranged on the substrate 602. A cable electrically connected to a power supply portion (not shown) may be inserted into each of the first connector 612 and the second connector 614. Accordingly, an electrical signal can be supplied to the light emitting element 604 through the first wire 606 and the second wire 608.

In one embodiment of this application, the first wire 606 and the second wire 608 may be any one of a gate line or a data line, respectively. For example, when the first wire 606 is a gate line, the second wire 608 becomes a data line, and when the first wire 606 is a data line, the second wire 608 becomes a gate line.

On the other hand, as shown in FIG. 6, the first wire 606 and the second wire 608 of this application may be arranged so as to intersect with each other by having a predetermined angle. As described above, the first wire 606 and the second wire 608 are arranged so as to intersect with each other so that an area, in which the light emitting element 604, the first wire 606, the second wire 608, the connecting element 610 occupy, is further reduced.

If the first wire 606 and the second wire 608 are desired to be arranged on the substrate 602 so as not to intersect with each other for the first wire 606 and the second wire 608, in other words, not to electrically contact to each other for the first wire 606 and the second wire 608, an area much larger than that of FIG. 6 will be required based on the same number of light emitting element. However, when the first wire 606 and the second wire 608 are arranged so as to intersect with each other as in FIG. 6, it is possible to arrange much larger number of light emitting element on the substrate 602 based on the same area. As described above, as the number of the light emitting element arranged on the same area increases, there is an effect in which a resolution of a display device increases consequentially.

However, even if the first wire 606 and the second wire 608 are arranged so as to intersect with each other as in FIG. 6, if the first wire 606 and the second wire 608 electrically contacts with each other, a short circuit will occur. In order to prevent such a short circuit phenomenon, the connecting element 610 may be arranged at an intersection point of the first wire 606 and the second wire 608 as in FIG. 6. Hereinafter, an arrangement relationship of the first wire, the second wire, and the connecting element according to this application will be described in more detail with reference to FIGS. 7 and 8.

Figure 7:
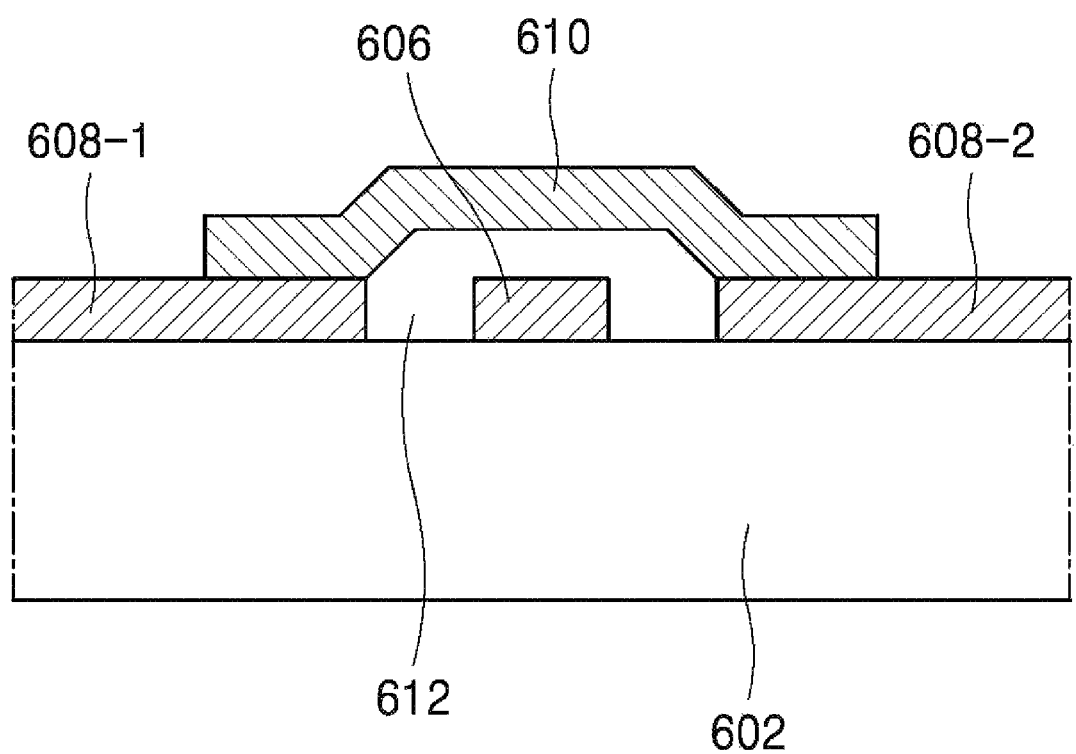
FIG. 7 is a view showing an arrangement relationship of a first wire, a second wire, and a connecting element according to an exemplary embodiment of this application in a second wire direction.

FIG. 7 is a view showing an arrangement relationship of a first wire, a second wire, and a connecting element according to an exemplary embodiment of this application in a second wire direction.

Referring to FIG. 7, a first wire 606 may be arranged on a substrate 602 and the second wires 608-1 and 608-2 may be arranged so as to intersect with the first wire 606. 7. As shown in FIG. 7, the second wires 608-1 and 608-2 may be disconnected at an intersection point with the first wire 606, and a connecting element 610 may be electrically connected to both ends of the disconnected second wires 608-1 and 608-2.

In this application, the connecting element 610 means an element that has a very small resistance value as a conductor. The connecting element 610 may be an element to maintain a flow of a current through the second wires 608-1 and 608-2 while preventing an electrical contact of the first wire 606 and the second wires 608-1 and 608-2. Thus, it is preferable to be close to 0 for a resistance value of the connecting element 610, in order to minimize a current loss by the connecting element 610.

Since the connecting element 610 is a conductor as mentioned above, it may be arranged to be spaced apart from the first wire 606 to prevent a short circuit with the first wire 606. In the embodiment of FIG. 7, the connecting element 610 may be arranged on an upper portion of the first wire 606. Accordingly, an insulating layer 612 may be formed between the first wire 606, the second wires 608-1 and 608-2, and the connecting element 610. The insulating layer 612 may be an empty space or may be made of an insulating material.

Figure 8:
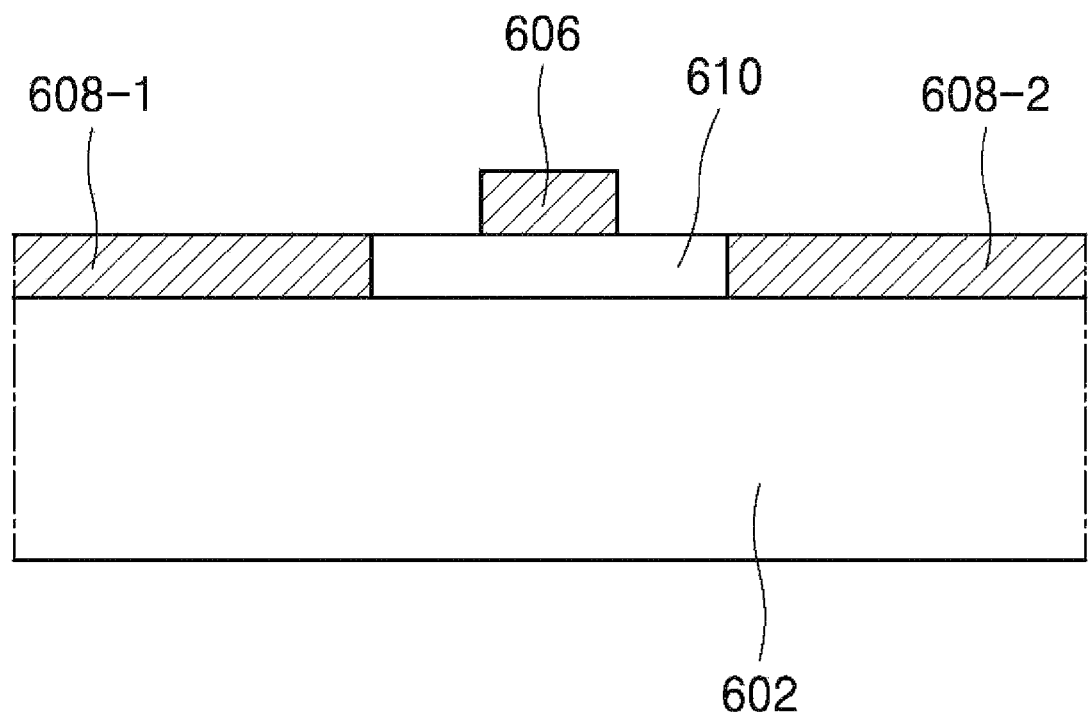
FIG. 8 is a view showing an arrangement relationship of a first wire, a second wire, and a connecting element according to another embodiment of this application in a second wire direction.

FIG. 8 is a view showing an arrangement relationship of a first wire, a second wire, and a connecting element according to another embodiment of this application in a second wire direction.

Referring to FIG. 8, a first wire 606 may be arranged on a substrate 602, and the second wires 608-1 and 608-2 may be arranged so as to intersect with the first wire 606. As shown in FIG. 8, the second wires 608-1 and 608-2 may be disconnected at an intersection point with the first wire 606, and a connecting element 610 may be electrically connected to both ends of the disconnected second wires 608-1 and 608-2.

In the embodiment of FIG. 7 described above, while the connecting element 610 may be arranged in the upper portion of the first wire 606, in the embodiment shown in FIG. 8, the connecting element 610 may be arranged under the first wire 606.

Figure 9:
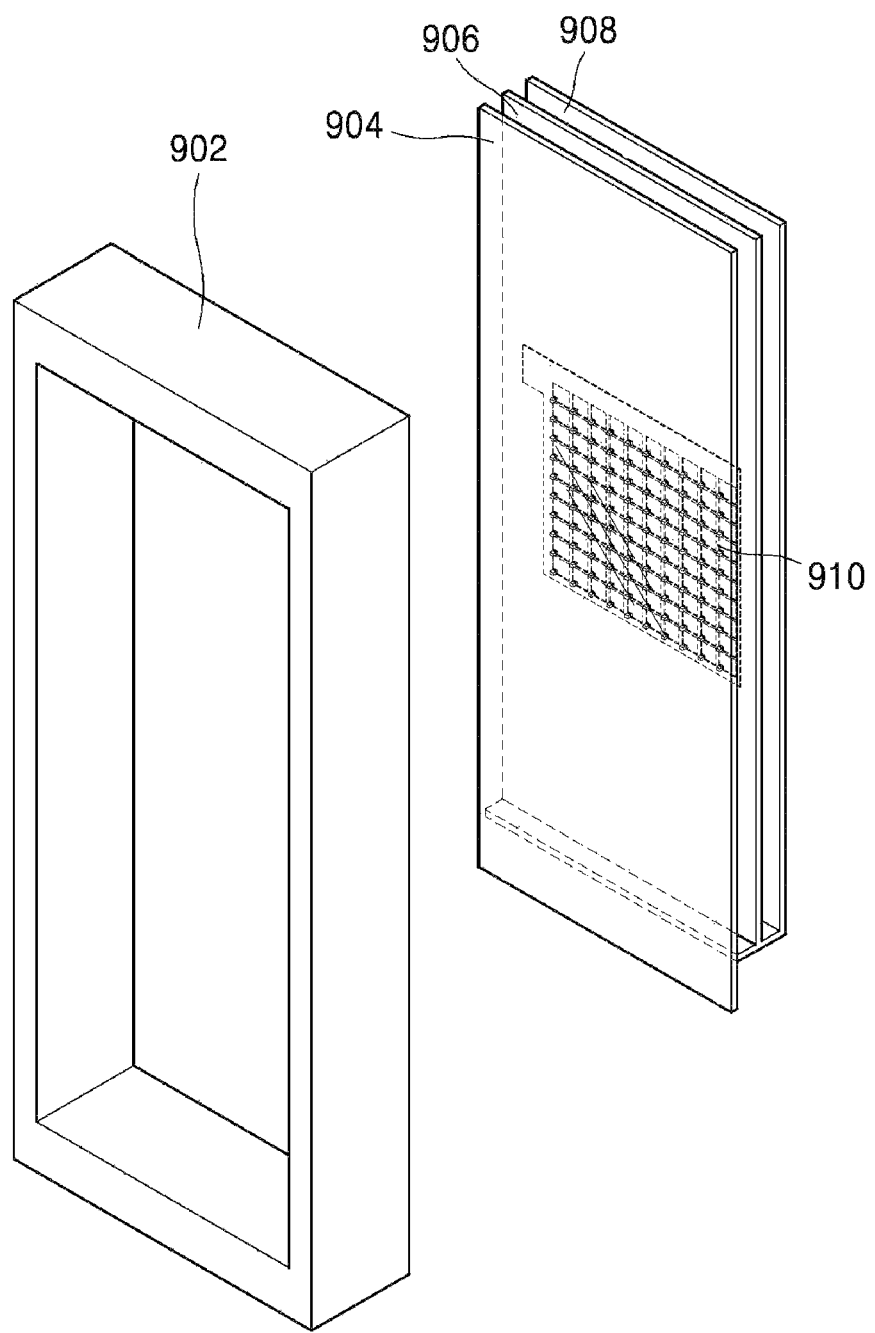
FIG. 9 is an overall configuration view of a display device for a refrigerator door according to a third embodiment of this application.

FIG. 9 is an overall configuration view of a display device for a refrigerator door according to a third embodiment of this application.

Referring to FIG. 9, a display device for a refrigerator door according to a first embodiment of this application may include a first panel 904, a second panel 906, and a display module 910 arranged between the first panel 904 and the second panel 906. Further, the display device for the refrigerator door according to the first embodiment of this application may further include a third panel 908 arranged on a rear surface of the second panel 906. Further, the display device for the refrigerator door according to the first embodiment of this application may further include a frame 902 for fixing the first panel 904, the second panel 906, and the third panel 908.

The first panel 904 and the second panel 906 may each be made of a transparent material, for example, a material such as transparent glass or transparent plastic. Accordingly, a user can identify the stored goods inside a refrigerator with the naked eye through the first panel 904 and the second panel 906. A coating for realizing a special function, for example, a mirror coating, may be applied to a front surface or a rear surface of the first panel 904.

The second panel 906 may be spaced apart from the first panel 904 by a predetermined distance. Accordingly, a first space that has a predetermined transverse length, vertical length, and depth may be formed between the first panel 904 and the second panel 906.

In the embodiment of FIG. 9, the display module 910 may be attached on the second panel 906. For reference, the position of the display module 910 on the second panel 906 may vary depending on the embodiment. The display module 910 may be supplied with a power supply by a power supply portion (not shown) and can display information related to the refrigerator according to a control by a control portion (not shown). In one embodiment of this application, the display module 910 may include a plurality of light emitting elements for a information display, and the first wire and the second wire for light-emitting a light emitting element. A detailed configuration of the display module 910 will be described in more detail through FIG. 10.

The third panel 908 may be spaced apart from the second panel 906 by a predetermined distance. The third panel 908 may also be made of the same transparent material as the first panel 904 and the second panel 906. The distance between the first panel 904 and the second panel 906 and the distance between the second panel 906 and the third panel 908 may be the same each other or different from each other. Another module other than the display module 910 may be further arranged in a second space formed between the second panel 906 and the third panel 908.

The first panel 904, the second panel 906, and the third panel 908 may be inserted into and fixed to the frame 902 shown in FIG. 9. As the first panel 904, the second panel 906, and the third panel 908 is inserted into and fixed to the frame 902, the first space formed between the first panel 904 and the second panel 906 and the second space formed between the second panel 906 and the third panel 908 can be sealed from an outside. Gas for thermal insulation for blocking a phenomenon in which a cool air inside the refrigerator leaks to the outside may be injected in each of the first space and the second space.

Although not shown in FIG. 9, a hinge portion (not shown) may be provided on a side portion of the frame 902. When the hinge portion (not shown) is provided on the side portion of the frame 902, the display device for the refrigerator door shown in FIG. 9 may be operated as a sub door by being rotatably connected to the main frame 202 of the main door 106 in the same manner as the sub door 210 shown in FIG. 2. In another embodiment of this application, the display device for the refrigerator door may be mounted on the refrigerator as a main door, not the sub door as in FIG. 2 (see FIG. 11), and may be inserted into and fixed to a part of the refrigerator door to have a function as a window (see FIG. 12).

Finally, in the case of applying the display device for the refrigerator door that has the structure as in FIG. 9 to the refrigerator, in applying a transparent panel, the separate display module 214 shown in FIG. 2 is not needed, and may realize an information display function by using the refrigerator door itself.

Figure 10:
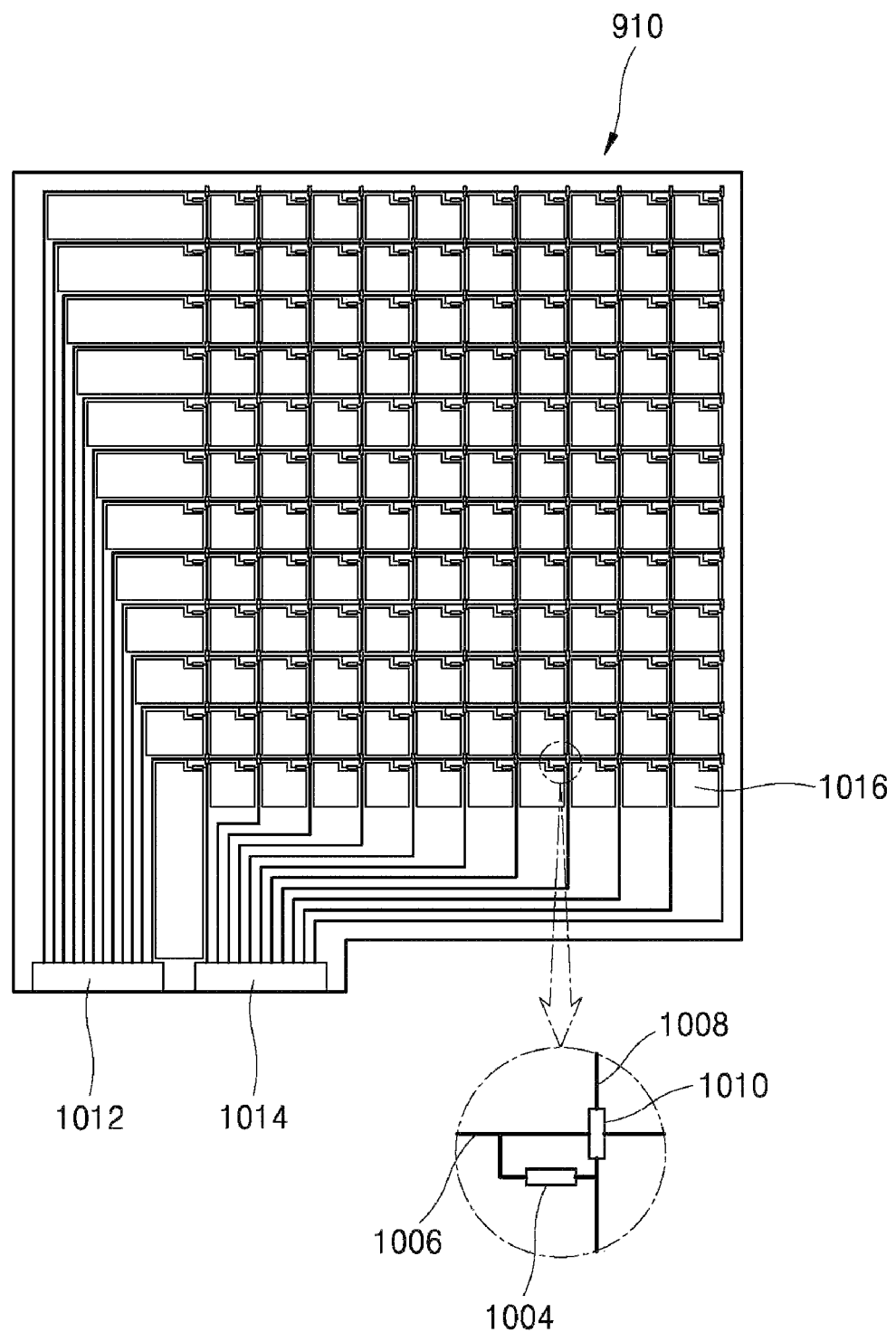
FIG. 10 is a configuration view of a display module according to a third embodiment of this application.

FIG. 10 is a configuration view of a display module according to a third embodiment of this application.

As mentioned above, in the third embodiment of this application, a display module 910 may be attached on a second panel 906. Referring to FIG. 6, the display module 910 according to an exemplary embodiment of this application may include a plurality of light emitting elements (for example, 1004) arranged on a substrate 1002 in a predetermined pattern. Further, on the substrate 1002, a first wire (for example, 1006) electrically connected to the light emitting element 1004 may be arranged. Further, a second wire (for example, 1008), which is electrically connected to the light emitting element 1004 and is arranged to intersect with the first wire 1006, may be arranged on the substrate 1002. Further, a connecting element 1010 for preventing an electrical contact between the first wire 1006 and the second wire 1008 may be arranged on the substrate 1002.

Further, a first connector 1012 connected to the first wire 1006 and a second connector 1014 connected to a second wire 1008 may be arranged on the substrate 1002.

In the third embodiment of this application, the substrate 1002 of the display module 910 may be a Flexible Printed Circuit Board (FPCB). The FPCB may have a flexible property and an attachment to another object is easy. Accordingly, the display module 910 including the substrate 1002 made of the FPCB can be attached on the second panel 906. At this time, the display module 910 may be attached to a front surface of a second panel and may be arranged between the first panel 904 and the second panel 906. However, according to an embodiment, the display module 910 may be attached to a rear surface of the first panel 904 or a rear surface of the second panel 906, or may be attached to a front surface or a rear surface of the third panel 908.

As an operation and an arrangement relationship of the light emitting element 1004, the first wire 1006, the second wire 1008, the connecting element 1010, the first connector 1012, and the second connector 1014 shown in FIG. 10 may be substantially identical to an operation and an arrangement relationship of the light emitting element 604, the first wire 604, the second wire 608, the connecting element 610, the first connector 612, and the second connector 614 described with reference to FIGS. 6 to 8, a detailed description will be omitted here.

Meanwhile, in the third embodiment of this application, when the display module 910 is mounted on the second panel 906, it is difficult for the user to see an inside of the refrigerator through the area where the display module 910 is attached. Thus, in order to increase an area that a user can see, in the third embodiment of this application, it is possible to remove the area in which the light emitting element 604, the first wire 606, the second wire 608, and the connecting element 610 are not arranged on the substrate 910. As described above, the user can identify the inside of the refrigerator through an area (for example, 1016) that the substrate 910 is removed.

Figure 11:
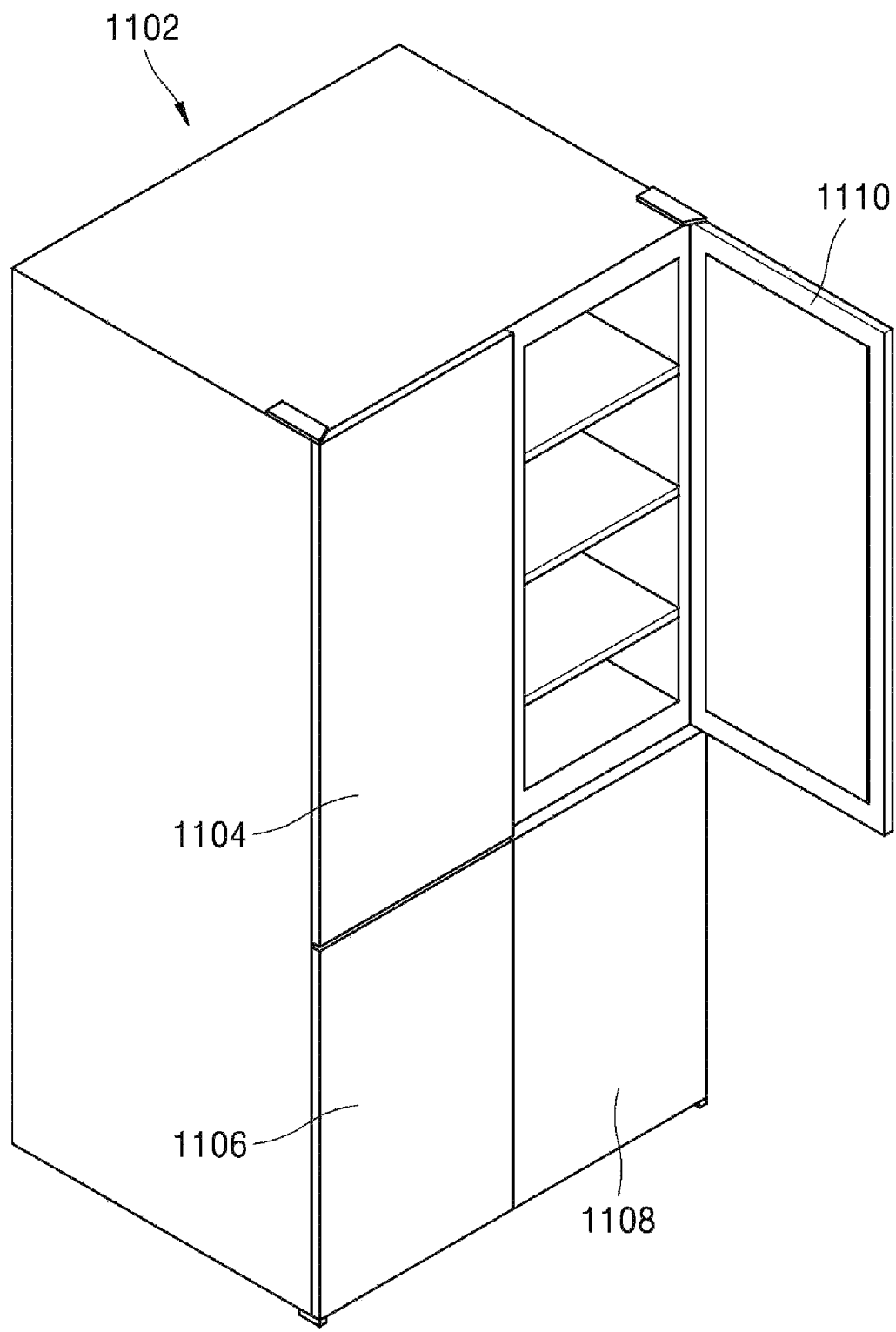
FIG. 11 is a perspective view of a refrigerator to which a display device for a refrigerator door according to an exemplary embodiment of this application is applied.

FIG. 11 is a perspective view of a refrigerator to which a display device for a refrigerator door according to an embodiment of this application is applied.

In FIG. 11, a refrigerator 1102 that has four main doors 1104, 1106, 1108, and 1110 is shown. According to an exemplary embodiment of this application, at least one of the main doors 1104, 1106, 1108, and 1110 may be a display device for a refrigerator door according to an embodiment of this application described above. For example, referring to FIG. 11, the main door 1110 may be any one of the display device shown in FIG. 3, FIG. 5, and FIG. 9.

As described above, the display device shown in FIGS. 3, 5, and 9 may each replace a function of the sub door 210 mounted on the main door 202 of the refrigerator shown in FIG. 2. However, in the embodiment shown in FIG. 11, the display device shown in FIGS. 3, 5, and 9 may be mounted on the refrigerator 1102 as the main door 1110, not the sub door.

Figure 12:
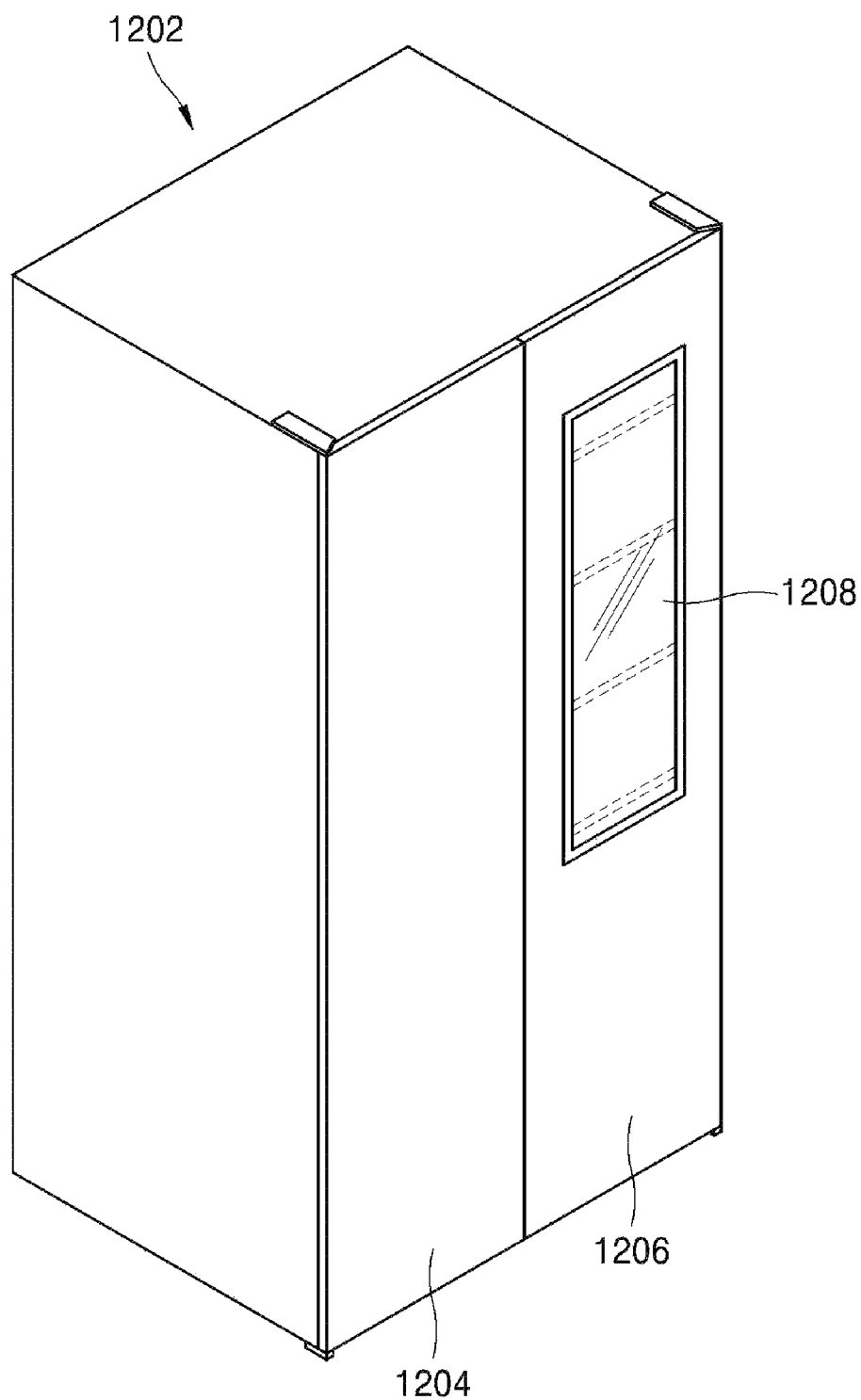
FIG. 12 is a perspective view of a refrigerator to which a display device for a refrigerator door according to an exemplary embodiment of this application is applied.

FIG. 12 is a perspective view of a refrigerator to which a display device for a refrigerator door according to an embodiment of this application is applied.

A refrigerator 1202 mounted with two main doors 1204 and 1206 is shown in FIG. 12. According to an exemplary embodiment of this application, the display device for the refrigerator door according to an embodiment of this application can be inserted into and fixed to a specific position of a main door like a kind of window. For example, referring to FIG. 12, a receiving portion for receiving the display device according to this application may be formed at the specific position of the main door 1206, and in the receiving portion, any one of the display devices shown in FIG. 3, FIG. 5, and FIG. 9 can be inserted and fixed.

However, the display device according to this application does not necessarily have to be fixedly connected to the main door 1206 in the embodiment of FIG. 12. In other words, the display device according to this application may be rotatably connected to a receiving portion formed in the main door 1206 through the hinge portion to perform a function as a sub door. That is, the display device according to this application may form at least a part of the refrigerator door.

Various substitutions, changes, and modifications may be possible within the range that does not deviate the technical idea of this application for those skilled in the art to which this application pertains, the above-mentioned application is not limited by the above-mentioned embodiment and the accompanying drawings.

The invention claimed is:

1. A refrigerator door having a display device, the refrigerator door comprising:
   a first panel made of a transparent material;
   a second panel made of a transparent material and spaced apart from the first panel by a predetermined distance; and
   a display provided between the first panel and the second panel,
   wherein the display comprises:
      a plurality of light emitting elements arranged in a predetermined pattern;
      at least one first wire electrically connected to the plurality of light emitting elements; and
      at least one second wire electrically connected to the plurality of light emitting elements and arranged to cross over the first wire at the intersections of the at least one first wire and the at least one second wire.

2. The refrigerator door of claim 1, wherein the at least one second wire is divided into a plurality of segments, and the display further comprises a plurality of electrical connectors that electrically connect adjacent segments of the second wire at each light emitting element to prevent an electrical contact between the at least one first wire and the at least one second wire.

3. The refrigerator door of claim 2, wherein each of the plurality of electrical connectors is connected to at least two segments of the at least one second wire, and wherein the at east one first wire passes either above or below each of the plurality of electrical connectors.

4. The refrigerator door of claim 2, wherein each of the plurality of electrical connectors is spaced apart from the at least one first wire.

5. The refrigerator door of claim 2, wherein the display further comprises an insulation layer provided between each of the plurality of electrical connectors and the at least one first wire.

6. The refrigerator door of claim 1, wherein the display further comprises a first power connector connected to the at least one first wire, and a second power connector connected to the at least one second wire.

7. The refrigerator door of claim 1,
   wherein the display comprises:
      a Printed Circuit Board (PCB) on which the plurality of light emitting elements, the at least one first wire, and the at least one second wire are arranged;
      a guide plate that includes a plurality of holes corresponding to the pattern of the plurality of light emitting elements mounted on the PCB; and
      at least one cover plate mounted on a front surface or a rear surface of the PCB.

8. The refrigerator door of claim 1, wherein the plurality of light emitting elements, the at least one first wire, and the at least one second wire are directly mounted on a surface of the second panel.

9. The refrigerator door of claim 1,
   wherein the display comprises a flexible printed circuit board (FPCB) on which the plurality of light emitting elements, the at least one first wire, and the at least one second wire are arranged, and
   wherein the FPCB is attached to a surface of the second panel.

10. The refrigerator door of claim 1, wherein a first space formed between the first panel and the second panel is filled with a thermal insulating gas.

11. A refrigerator, comprising:
   a cabinet that forms a refrigerating space;
   a door, configured to open and close the cabinet;
   a display device that forms at least a part of the door and displays information related to the refrigerator; and
   a controller that controls a supply of an electrical signal to the display device to display the information,
   wherein the display device comprises:
      a first panel made of a transparent material;
      a second panel made of a transparent material and spaced apart from the first panel by a predetermined distance; and
   a display provided between the first panel and the second panel,
   wherein the display comprises:
      a plurality of light emitting elements arranged in a predetermined pattern;
      at least one first wire electrically connected to each of the plurality of light emitting elements; and
      at least one second wire electrically connected to each of the plurality of light emitting elements, wherein the at least one second Tire is divided into a plurality of segments, and wherein the at least one first wire runs between sequential segments of the at least one second wire.

12. The refrigerator of claim 11, wherein the display further comprises a plurality of electrical connectors that electrically connect sequential segments of the second wire at each light emitting element so as to prevent an electrical contact of the at least one first wire and the at least one second wire.

13. The refrigerator of claim 12, wherein each of the plurality of electrical connectors is connected to at least two segments of the at least one second wire, and wherein the at least one first wire passes above or beneath each of the plurality of electrical connectors.

14. The refrigerator of claim 12, wherein each of the plurality of electrical connectors is spaced apart from the at least one first wire.

15. The refrigerator of claim 12, wherein the display further comprises an insulating layer provided between the connecting element and the first wire.

16. A refrigerator door, comprising:
   a first pane of glass;
   a second pane of glass spaced apart from the first pane of glass by a predetermined distance;
   a frame that supports the first and second panes of glass; and
   a display provided between the first and second panes of glass, wherein the display comprises:

a predetermined pattern of pixels;

at least one first wire electrically connected to the predetermined pattern of pixels, the at least one first wire extending in a first direction; and at least one second wire electrically connected to the predetermined pattern of pixels, the at least one second wire extending in a second direction different from the first direction, wherein the display is configured to allow an item behind the second pane of glass to be seen when viewed from a front of the first pane of glass.

17. The refrigerator door of claim 16, further comprising a plurality of electrical connectors, wherein the at least one second wire is divided into a plurality of segments, and wherein each of the plurality of electrical connectors electrically connects two segments of the plurality of segments.

18. The refrigerator door of claim 17, further comprising an insulation layer provided between the at least one first wire and each of the plurality of electrical connectors such that the at least one first wire does not contact the plurality of electrical connectors or the at least one second wire.

19. The refrigerator door of claim 16, further comprising a first power connector connected to the at least one first wire and a second power connector connected to the at least one second wire.

20. The refrigerator door of claim 16, further comprising a third pane of glass spaced apart from the second pane of glass by a predetermined distance, wherein a first space between the first and second panes of glass and a second space between the second and third panes of glass are filled with a thermally insulating gas.

* * * * *